United States Patent
Chiriac et al.

(10) Patent No.: US 9,136,202 B2
(45) Date of Patent: Sep. 15, 2015

(54) ENHANCED PACKAGE THERMAL MANAGEMENT USING EXTERNAL AND INTERNAL CAPACITIVE THERMAL MATERIAL

(75) Inventors: Victor A. Chiriac, San Diego, CA (US); Durodami J. Lisk, San Diego, CA (US); Ratibor Radojcic, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 6 days.

(21) Appl. No.: 13/448,711

(22) Filed: Apr. 17, 2012

(65) Prior Publication Data

US 2013/0270721 A1    Oct. 17, 2013

(51) Int. Cl.
*H01L 23/28* (2006.01)
*H01L 23/427* (2006.01)
*H01L 23/433* (2006.01)

(52) U.S. Cl.
CPC ........ *H01L 23/4275* (2013.01); *H01L 23/4334* (2013.01); *H01L 2224/16145* (2013.01); *H01L 2224/16225* (2013.01); *H01L 2924/15174* (2013.01); *H01L 2924/15184* (2013.01); *H01L 2924/15311* (2013.01)

(58) Field of Classification Search
USPC .......... 257/686, 691, 704, 723, 796; 438/106, 438/122
See application file for complete search history.

(56) References Cited

U.S. PATENT DOCUMENTS

| | | | |
|---|---|---|---|
| 6,104,611 A | 8/2000 | Glover et al. | |
| 6,870,736 B2 * | 3/2005 | Lee et al. | 361/704 |
| 7,031,162 B2 * | 4/2006 | Arvelo et al. | 361/718 |
| 7,253,523 B2 | 8/2007 | Dani et al. | |
| 7,476,568 B2 | 1/2009 | Lu et al. | |
| 7,491,577 B2 | 2/2009 | Sturcken et al. | |
| 2004/0113266 A1 * | 6/2004 | Lee et al. | 257/723 |
| 2005/0224953 A1 * | 10/2005 | Lee et al. | 257/704 |
| 2009/0224400 A1 | 9/2009 | Rahman | |
| 2010/0126708 A1 | 5/2010 | Mikami | |
| 2010/0230805 A1 | 9/2010 | Refai-Ahmed | |

FOREIGN PATENT DOCUMENTS

DE    19932441 A1    1/2001
GB    2462620 A       2/2010

OTHER PUBLICATIONS

Merriam-Webster Dictionary definition for "reservoir".*
International Search Report and Written Opinion—PCT/US2013/036907—ISA/EPO—Sep. 27, 2013.

* cited by examiner

*Primary Examiner* — Errol Fernandes
(74) *Attorney, Agent, or Firm* — Michelle S. Gallardo

(57) ABSTRACT

An apparatus has external and/or internal capacitive thermal material for enhanced thermal package management. The apparatus includes an integrated circuit (IC) package having a heat generating device. The apparatus also includes a heat spreader having a first side that is attached to the IC package. The apparatus also includes capacitive thermal material reservoirs contacting the first side of the heat spreader. The capacitive thermal material reservoirs may be disposed laterally relative to the heat generating device.

13 Claims, 9 Drawing Sheets

Cross Sectional View
370

Partial Sectional Top View
380

Cross-Sectional View
470

Partial Sectional Top View
480

| | Illustration of the Device | Method |
|---|---|---|
| 501 | Attach capacitive thermal material (pockets) to heat spreader backside | Use adhesive to attach capacitive thermal material to heat spreader backside. Or use other methods to attach thermal capacitive material |
| 502 | | Attach heat sink to IC package |
| 503 | | Create grooves in the package mold compound and fill with capacitive thermal material. Attach heat sink to IC package |

FIG. 5

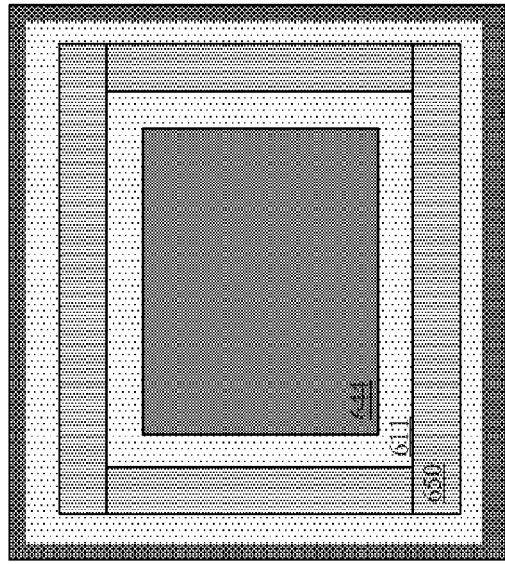
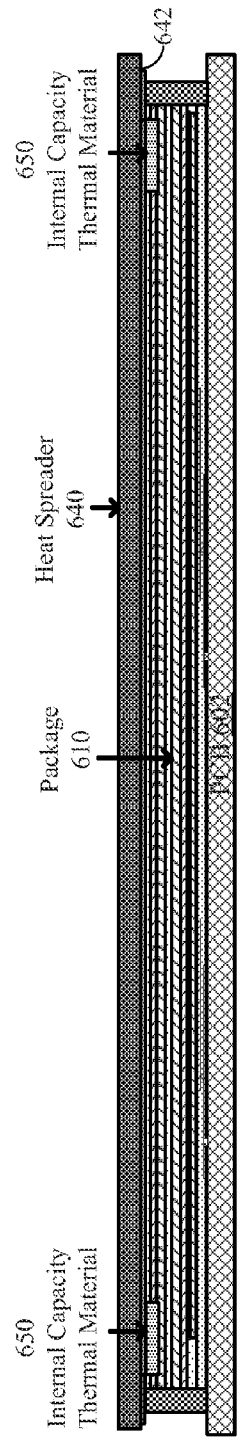
Cross-Sectional View 670
FIG. 6A
Partial Sectional Top View 680
FIG. 6B
Side View 690
FIG. 6C

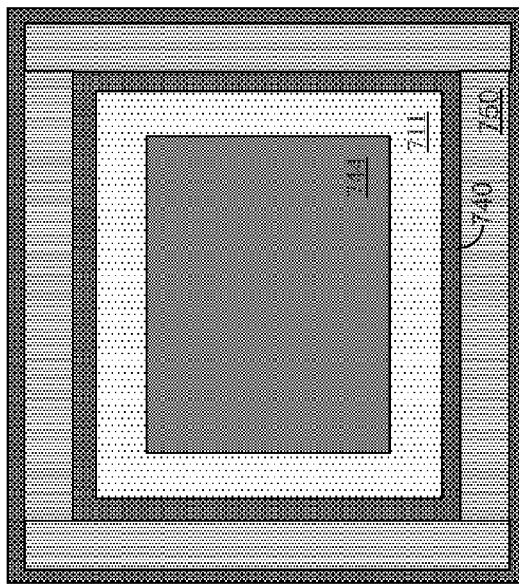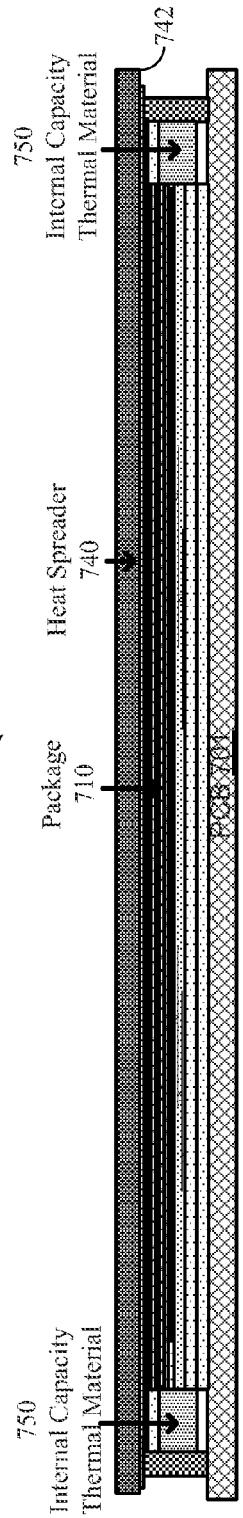

ENHANCED PACKAGE THERMAL MANAGEMENT USING EXTERNAL AND INTERNAL CAPACITIVE THERMAL MATERIAL

TECHNICAL FIELD

The present disclosure generally relates to integrated circuits (ICs). More specifically, the present disclosure relates to enhanced thermal package management using external and/or internal capacitive thermal material.

BACKGROUND

A 3D package may contain two or more chips (integrated circuits (ICs)) stacked vertically so that they occupy less floor space and/or have greater connectivity. In some new 3D packages, through-silicon vias replace edge wiring by creating vertical connections through the body of the chips. The resulting package has no added length or width. Because no interposer is used, a TSV 3D package can also be flatter than an edge-wired 3D package. This TSV technique is sometimes also referred to as TSS (Through-Silicon Stacking).

Heat dissipation is increasingly problematic for high end chips that use die stacking. In particular, stacking two or more chips may lead to localized thermal hot spots. As the localized thermal hot spots are embedded in the stack-up, this may reduce the ability to cool the hot spots and achieve low junction temperatures. Conventional cooling solutions for achieving low junction temperatures include heat sinks, heat spreaders, and/or improved printed circuit boards. Conventional techniques of simply increasing the size of the heat spreader and/or the heat sink are impractical in small form factor devices (e.g., Smartphones).

SUMMARY

According to one aspect of the present disclosure, an apparatus including external and/or internal capacitive thermal material for enhanced thermal package management is described. The apparatus includes an integrated circuit (IC) package having a heat generating device. The apparatus also includes a heat spreader having a first side that is attached to the IC package. The apparatus also includes capacitive thermal material reservoirs that contact the first side of the heat spreader. The capacitive thermal material reservoirs may be disposed laterally relative to the heat generating device.

In a further aspect of the disclosure, a method for enhanced thermal package management is described. The method includes laterally spreading heat from a heat generating device within an integrated circuit package. The method also includes absorbing the laterally spread heat within capacitive thermal material reservoirs that are disposed laterally relative to the heat generating device.

In another aspect of the disclosure, an apparatus has means for enhanced thermal package management. The apparatus includes an integrated circuit (IC) package having a heat generating device. The apparatus also includes a heat spreader having a first side that is attached to the IC package. The apparatus also includes means for thermally managing heat, which contacts the first side of the heat spreader. The means for thermally managing heat may be disposed laterally relative to the heat generating device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 5 shows a process of forming stacked IC packages of FIGS. 1A and 3B and 4A and 4B, including internal/external capacitive thermal material according to one aspect of the present disclosure.

FIGS. 6A-6C show a cross-sectional view, a partial sectional top view, and a side view illustrating the incorporation of the stacked IC package of FIGS. 4A and 4B, including the internal capacitive thermal material, into a wireless device according to one aspect of the disclosure.

FIGS. 7A-7C show a cross-sectional view, a partial sectional top view, and a side view illustrating the IC package of FIG. 3, including the internal capacitive thermal material, incorporated into a wireless device according to one aspect of the disclosure.

DETAILED DESCRIPTION

Figure 1:
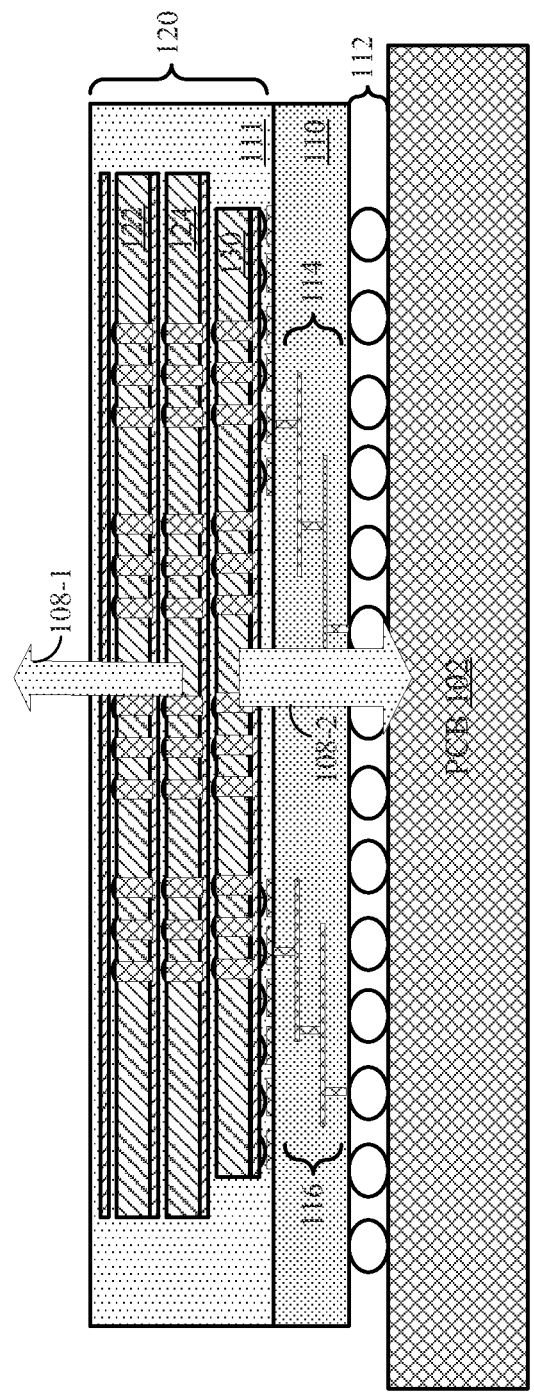
FIG. 1 shows a cross-sectional view illustrating the heat flow paths within a stacked integrated circuit (IC) according to one aspect of the disclosure.

Various aspects of the disclosure provide techniques to mitigate problems relating to heat dissipation within three-dimensional (3D) packages formed by TSS (Through-Silicon Stacking), PoP (Package on Package), or other like technique involving die or package stacking. An integrated circuit (IC) package may include a heat spreader having an internal surface and an external surface, with the internal surface contacting the IC package. According to one aspect of the present disclosure, enhanced thermal package management is provided by using a capacitive thermal material within the IC package. As described herein, a capacitive thermal material may include, but is not limited to, a phase change material, a thermally conductive material, or other like thermal material or thermal structure adapted to receive conducted heat (e.g., laterally conducted heat) and to store heat within its thermal reservoir.

In one aspect of the disclosure, the capacitive thermal material is composed of a phase change material that transitions into a different state (e.g., an initial solid state to a liquid state over time) for heat storage when heat contacts and activates the phase change material. In one configuration, heat stored within capacitive thermal material reservoirs is further cooled during low (or non) power operations, causing the phase change material to transition from the liquid state to a solid state over time. The phase change material may transition to a partial liquid and partial solid (in-between) state as the absorbed heat cools over time, before returning to the initial solid state.

In a configuration where a phase change material forms the reservoirs, the phase change material changes phase over time from an initial solid state to a liquid state having a high latent heat absorbency in the range of 80000-20000 Joules per kilogram (J/kg) that absorbs and stores an increased amount of energy, thus lowering the hot spot temperatures. For example, the phase change material may begin the transition from the initial solid state at a temperature of approximately twenty-nine degrees centigrade (29° C.) and achieves the liquid state at a temperature in the range of twenty-nine to thirty-seven degrees centigrade (29° C. to 37° C.). At temperatures below the range of twenty-nine to thirty-one degrees centigrade (29° C. to 31° C.), the phase change material may be in a partial liquid and a partial solid (in-between) state. When the power is low or there is no power dissipated in the system, the phase change material will cool slowly and begin transitioning into the initial solid shape. In one configuration, a heat spreader, attached to an IC package for cooling purposes, laterally disposes heat to activate the phase change material.

In one aspect of the disclosure, the capacitive thermal material includes phase change material (PCM) reservoirs contacting the internal surface of a heat spreader. In this aspect of the disclosure, the PCM reservoirs are disposed laterally relative to the heat generating device, chip stack, etc. In one configuration of the IC package, the capacitive thermal material is added to a backside of the heat spreader to further absorb and store the heat conducted by the heat spreader. In this configuration, the capacitive thermal material is external to the package as described in further detail with reference to FIGS. 3A and 3B.

In a further configuration of the IC package, the capacitive thermal material is internal to the package, for example inside a package mold compound surrounding an IC stack to absorb and/or store the heat from the heat spreader, as described in further detail with reference to FIGS. 4A and 4B. In this configuration, the capacitive thermal material is inserted in the package mold compound and acts as a heat capacitor. That is, the capacitive thermal material may be placed in grooved channels inside the package mold compound. In this configuration, the capacitive thermal material is thermally activated, when the heat spreader, placed onto the IC package, spreads heat from a hotspot within the IC package. The capacitive thermal material is activated in response to contact with channeled and/or conducted heat for storage within the capacitive thermal material reservoirs of the grooved channels inside the package mold compound thus cooling the hot spots. In this configuration, the internal, capacitive thermal material extends a volumetric thermal storage capability of a limited form factor device without increasing the surface area of the device, or the overall thickness of a stacked IC package.

FIG. 1 shows a cross-sectional view illustrating the main heat flow within a stacked integrated circuit (IC) package 100 according to one aspect of the disclosure. Representatively, the stacked IC package 100 includes a printed circuit board (PCB) 102 connected to a package substrate 110 with interconnects 112. In this configuration, the package substrate 110 includes conductive layers 114 and 116. Above the package substrate 110 is a 3D chip stack 120, including stacked dies 122, 124, and 130, encapsulated by mold compound 111. In one aspect of the disclosure, the die 130 is a mobile station modem (MSM), with stacked input/output (I/O) dies 122 and 124. As indicated by the arrows 108, heat is dissipated upwards (108-1) and downwards (108-2) from the active devices in the 3D chip stack 120. As shown in FIG. 1, a main heat flow path is indicated by downwards arrow 108-2 and a secondary heat flow path is indicated by upwards arrow 108-1.

Figure 2:
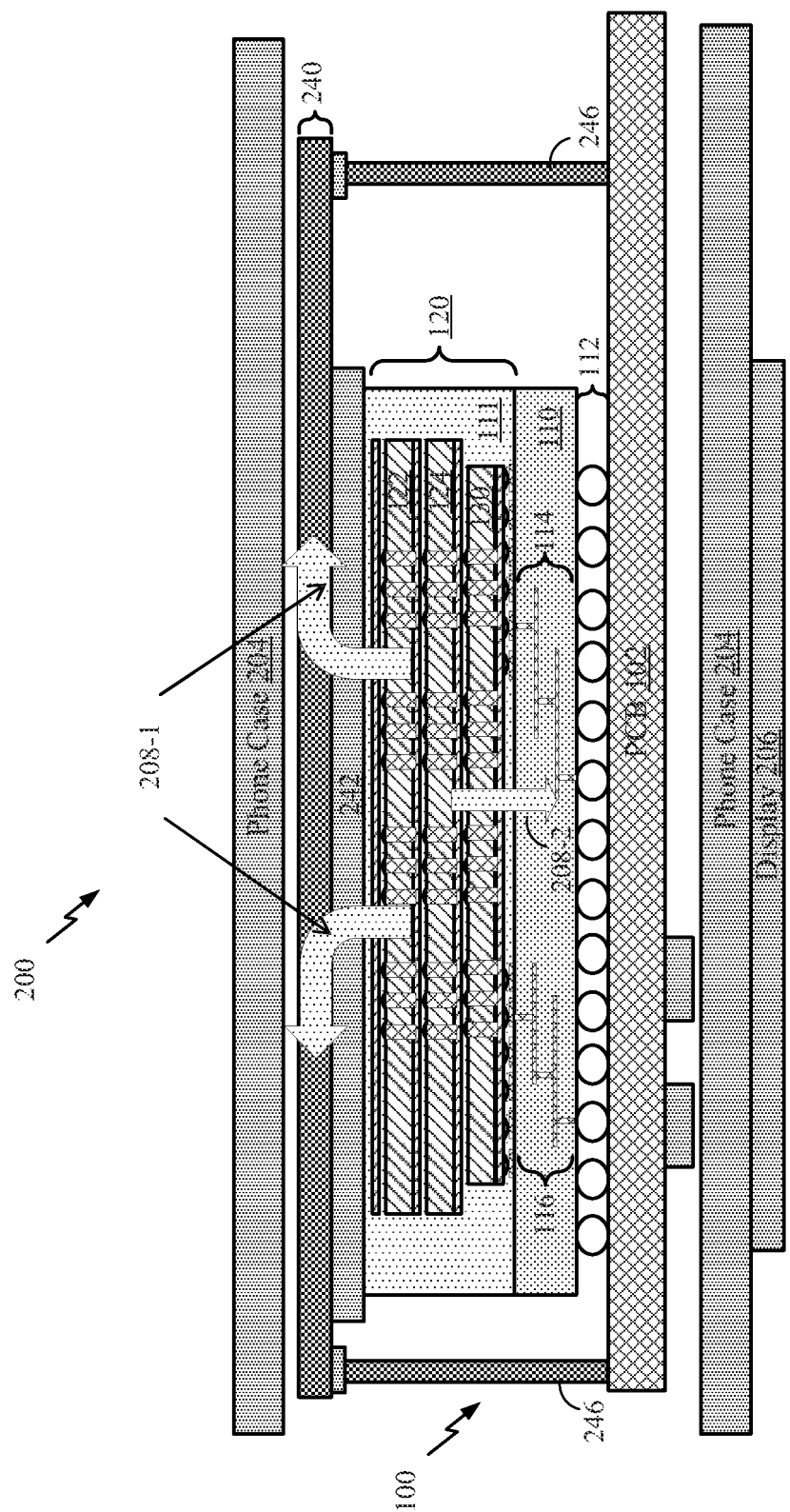
FIG. 2 shows a cross-sectional view illustrating the stacked IC package of FIG. 1, incorporated into a wireless device according to one aspect of the disclosure.

FIG. 2 shows a cross-sectional view illustrating the stacked IC package 100 of FIG. 1, incorporated into a wireless device 200 according to one aspect of the disclosure. As described herein, the wireless device 200 may include, but is not limited to, a Smartphone, tablet, handheld device, or other limited form factor device. Representatively, the stacked IC package 100 is arranged within a phone case 204, including a display 206. In this configuration, a thermal interface material (e.g., a TIM sponge) 242 connects a heat spreader 240 to the stacked IC package 100. Optional conductive support pillars 246 are shown. As indicated by the arrows 208, heat is dissipated upwardly and downwardly from the active devices in the 3D chip stack 120. That is, heat is dissipated upwardly (208-1) and downwardly (208-2) from the active devices within the 3D chip stack 120. In this configuration, the heat spreader 240 laterally dissipates heat, to provide a main heat flow path indicated by the arrows 208-1, whereas a secondary heat flow path is indicated by downward arrow 208-2.

Figure 3A:
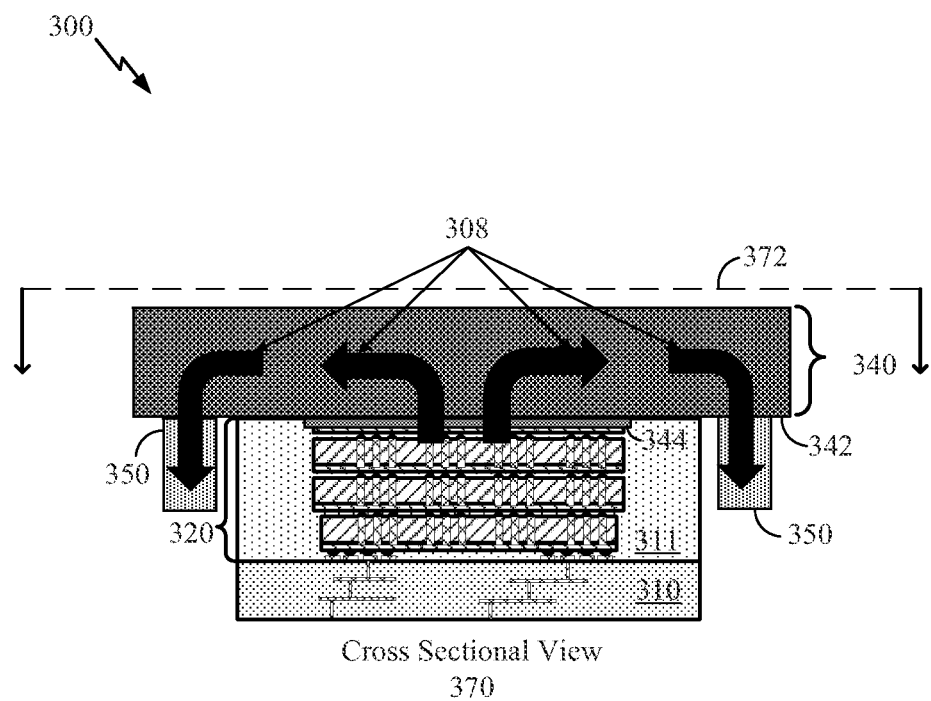
FIGS. 3A and 3B show a cross-sectional view and a partial sectional top view illustrating a stacked IC package including external capacitive thermal material according to one aspect of the disclosure.
Figure 3B:
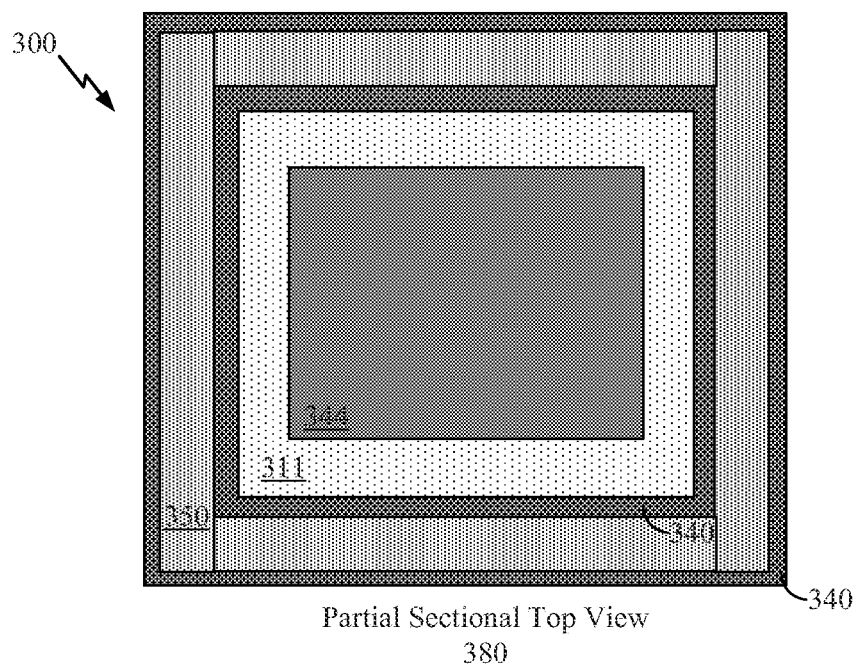

FIGS. 3A and 3B show a cross-sectional view 370 and a partial sectional top view 380 illustrating a stacked IC package 300 including external capacitive thermal material 350 according to one aspect of the disclosure. As shown in FIG. 3A, the external capacitive thermal material 350 is attached to a first side (e.g., a backside) 342 of the heat spreader 340 (e.g., outside the package) to further absorb and store the heat conducted by the heat spreader 340. In this configuration, a thermal interface material 344 attaches the heat spreader 340 to the package mold compound 311 of the stacked IC package 300 that encapsulates the 3D chip stack 320. As indicated by the arrows 308, heat is dissipated laterally to the external capacitive thermal material 350.

Although the external capacitive thermal material 350 is shown as not contacting the package mold compound 311 of the stacked IC package 300, in other configurations the external capacitive thermal material 350 contacts the package mold compound 311. The lateral distance between the external capacitive thermal material 350 and the package mold compound 311 of the stacked IC package 300 can be in the range of zero millimeters (0 mm) to the distance between the package mold compound 311 and the heat spreader 340, depending on whether other components are placed in the vicinity of the 3D chip stack 320 encapsulated by the package mold compound 311. Similarly, the clearance between the external capacitive thermal material 350 and the package substrate 110 may be in the range of 0 mm to 1.2 mm. FIG. 3B shows a partial sectional top view 380, through the heat spreader 340, as seen when viewed along the x-axis of the arrow 372 shown in FIG. 3A, with the 3D chip stack 320 being obscured by the thermal interface material 344.

In this configuration shown in FIGS. 3A and 3B, the 3D chip stack 320 generates heat that is conducted to the heat spreader 340 through the thermal interface material 344. The heat spreader 340 then spreads or conducts the heat generated from the stacked die within the 3D chip stack 320 and the external capacitive thermal material 350 receives the conducted heat. The capacitive thermal material activates upon receiving conducted heat. Once activated, the external capacitive thermal material 350 help reduces the temperature junction at the 3D chip stack 320 by capacitively storing the heat within the external capacitive thermal material 350 attached to the first side 342 of the heat spreader 340. The external capacitive thermal material 350 does this by changing phase to store the latent heat according to one aspect of the disclosure.

Figure 4A:
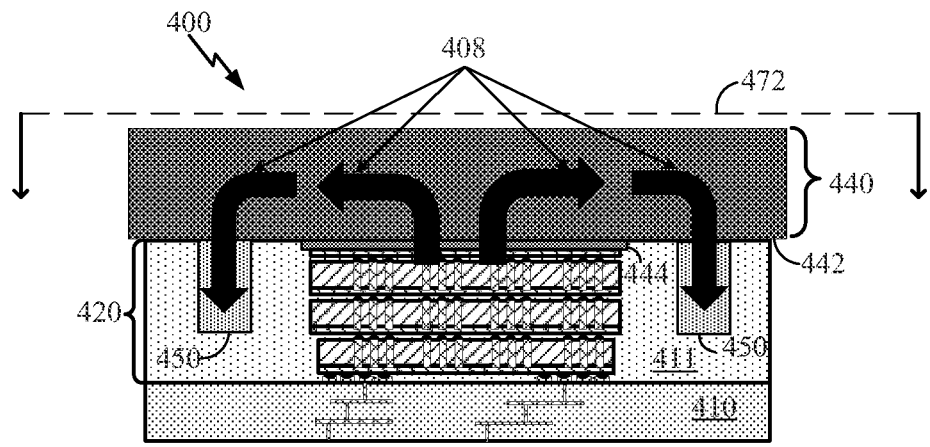
FIGS. 4A and 4B show a cross-sectional view and a partial sectional top view illustrating a stacked IC package including internal capacitive thermal material according to one aspect of the disclosure.
Figure 4B:
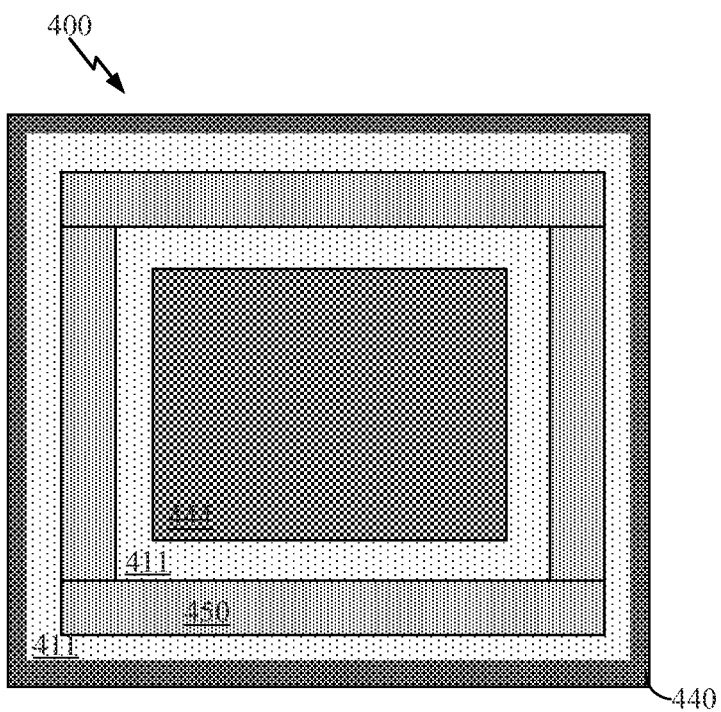

FIGS. 4A and 4B show a cross-sectional view 470 and a partial sectional top view 480 illustrating a stacked IC package 400 including internal capacitive thermal material according to one aspect of the disclosure. In FIG. 4A, the internal capacitive thermal material 450 is inserted inside a package mold compound at least partially surrounding the 3D chip stack 420. In this configuration, the internal capacitive thermal material 450 is internal to the package mold compound 411 of the stacked IC package 400 that encapsulates the 3D chip stack 420. That is, the internal capacitive thermal material 450 may be placed in channels created inside the package mold compound 411. The channels may be created by a chemical process, such as etching of the package mold compound 411, or a mechanical process, such as drilling into the package mold compound 411 to form the channels. FIG. 4B shows a partial sectional top view 480, through the heat spreader 440, as seen when viewed along the x-axis of the arrow 472 shown in FIG. 4A, with the 3D chip stack 420 being obscured by the thermal interface material 444.

In the configuration shown in FIGS. 4A and 4B, the internal capacitive thermal material 450 is thermally activated when the heat spreader 440 laterally spreads heat from a hotspot within the 3D chip stack 420 through the thermal interface material 444. Once activated, the internal capacitive thermal material 450 stores channeled and/or conducted heat within the internal capacitive thermal material reservoirs 450 of the channels inside the package mold compound. In this configuration, a thermal interface material 444 attaches the package mold compound 411 that encapsulates the 3D chip stack 420 to a first side (e.g. backside) 442 of the heat spreader 440. As indicated by the arrows 408, heat is dissipated laterally by the heat spreader 440 to activate the internal capacitive thermal material 450 to store the laterally dissipated heat. In this configuration, the internal capacitive thermal material 450 extends a volumetric thermal storage capability of a limited form factor device without increasing the surface area of the device, or the overall thickness of the stacked IC package 400.

FIG. 5 shows a process of forming stacked IC packages of FIGS. 3A-3B and 4A-4B, including internal/external capacitive thermal material according to one aspect of the present disclosure. At block 501, capacitive thermal material (e.g., a phase change material) is attached to a first side of a heat spreader, for example, as shown in FIGS. 3A and 3B. In one configuration, an adhesive attaches the capacitive thermal material to a first side of the heat spreader. For example, the capacitive thermal material may be directly attached or placed inside tubes/pipes attached to a backside 342 of the heat spreader 340, as shown in FIGS. 3A and 3B. At block 502, the heat spreader is attached to a stacked package, for example, as shown in FIGS. 3A and 3B, using a thermal interface material. In this configuration, the capacitive thermal material is a phase change material that is external to the stacked IC package.

As further shown in FIG. 5, at block 503, channel grooves are formed in a package mold compound. In this configuration, the grooves are filled with capacitive thermal material (e.g., a phase change material) to form capacitive thermal material reservoirs, for example, as shown in FIGS. 4A and 4B. In this configuration, the heat spreader is attached to a stacked IC package, for example, as shown in FIGS. 4A and 4B, using a thermal interface material. In this configuration, the capacitive thermal material is a phase change material that is internal to the stacked IC package. In this configuration, heat stored within capacitive thermal material reservoirs is farther cooled during low (or non) power operations. The phase change material can contact the die laterally on fewer than all lateral surfaces.

FIGS. 6A-6C show a cross-sectional view 670, a partial sectional top view 680, and a side view 690 illustrating the incorporation of a stacked IC package 400 of FIGS. 4A and 4B, including the internal capacitive thermal material, into a wireless device 600 according to one aspect of the disclosure. As shown in FIG. 6A, a thermal interface material 644 attaches a package mold compound 611 that encapsulates the 3D chip stack 620 to a first side (e.g., backside) 642 of the heat spreader 640. As indicated by the arrows 608, heat is dissipated laterally by the heat spreader 640 to activate the internal capacitive thermal material 650 for storage of the laterally dissipated heat. FIG. 6B shows a partial sectional top view 680, through the heat spreader 640, as seen when viewed along the x-axis of the arrow 672 shown in FIG. 6A, with the 3D chip stack 620 being obscured by the thermal interface material 644.

FIG. 6C illustrates a side view 690 of the wireless device 600 including internal capacitive thermal material 650 according to one aspect of the disclosure. As shown in FIGS. 6A-6C, the internal capacitive thermal material 650 is disposed within the package mold compound 611 of the package 610 formed on the printed circuit board 602. Representatively, the thermal interface material 644 couples the package mold compound 611 that encapsulates including the 3D chip stack 620 to a first side 642 of the heat spreader 640. In this configuration, a width of the internal capacitive thermal material 650 is approximately 160 microns. The capacitive material may contact the die side (laterally) or be separate.

FIGS. 7A-7C show cross-sectional view 770, a partial sectional top view 780, and a side view 790 illustrating the stacked IC package 300 of FIGS. 3A and 3B, including the external capacitive thermal material 750, incorporated into a wireless device 700 according to one aspect of the disclosure. As shown in FIG. 7A, a thermal interface material 744 attaches the package mold compound 711 than encapsulates the 3D chip stack 720 to a first side (e.g., a backside) 742 of the heat spreader 740. As indicated by the arrows 708, heat is dissipated laterally by the heat spreader 740 to activate the external capacitive thermal material 750 to store the laterally dissipated heat. FIG. 7B shows a partial sectional top view 780, through the heat spreader 740, as seen when viewed along the x-axis of the arrow 772 shown in FIG. 7A, with the 3D chip stack 720 being obscured by the thermal interface material 744.

FIG. 7C illustrates a side view 790 of the wireless device 700 including external capacitive thermal material 750 according to one aspect of the disclosure. Representatively, the external capacitive thermal material 750 is formed surrounding the package 710, which is formed on the printed circuit board 701, including the heat spreader 740 coupled by the thermal interface material 744 to a package mold compound 711, as shown in FIGS. 7A and 7B. In this configuration, the external capacitive thermal material is attached to a backside 742 of the heat spreader 740. In this configuration, a width of the external capacitive thermal material 750 is approximately 160 microns but can be thicker, as it is not internal to the mold compound of the package 710, and may be extended based on the clearance allowed by the printed circuit board 701. Although the external capacitive thermal material 750 is shown surrounding the package 710, it can be adjacent to fewer than all sides of the package 710.

In one configuration, the wireless device 700 includes means for thermal management that is disposed laterally relative to a heat generating device (e.g., an active device of a 3D chip stack). In one aspect, the means for thermal management may be the capacitive thermal material 350/450/650/750 of FIGS. 3A and 3B, 4A and 4B, 6A-6C, and 7A-7C, configured to perform the functions recited by the thermal management means. In another aspect, the aforementioned means may be any device or any layer configured to perform the functions recited by the aforementioned means.

Figure 8:
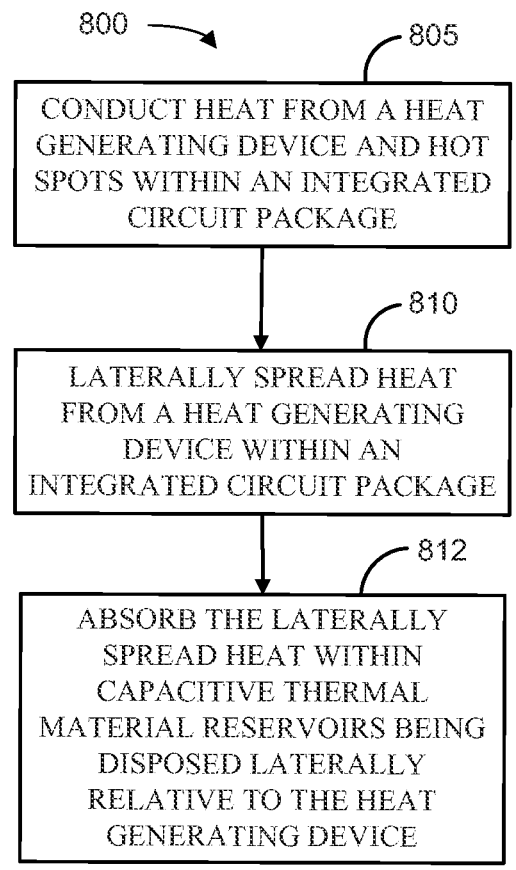
FIG. 8 is a block diagram illustrating a method for providing enhanced thermal package management using external/internal capacitive thermal material according to one aspect of the disclosure.

FIG. 8 is a block diagram illustrating a method for providing enhanced thermal package management using external/internal capacitive thermal material according to one aspect of the disclosure. At block 805, heat is conducted from the integrated circuit hot spots to a heat spreader. At block 810, heat is laterally spread (e.g., conducted and/or channeled) from a heat generating device within an integrated circuit package, for example, as shown in FIGS. 3A, 3B, 4A, 4B, 6A-6C, and 7A-7C. At block 812, the laterally spread heat is absorbed within a capacitive thermal material, for example, as shown in FIGS. 3A, 3B, 4A, 4B, 6A-6C, and 7A-7C.

For example, as shown in FIGS. 4A and 4B, the internal capacitive thermal material 450 is inserted, in the package mold compound 411 and acts as a heat capacitor. In this configuration, the internal capacitive thermal material 450 is thermally activated when the heat spreader 440, placed onto the package mold compound 410 that encapsulates the 3D chip stack 420, spreads heat from a hotspot within the 3D chip stack 420. That is, the internal capacitive thermal material 450 may transition into a different state (e.g., a liquid) for heat storage when the heat contacts and activates the internal capacitive thermal material 450. In this configuration, heat stored within the reservoirs formed from the internal capacitive thermal material 450 is further cooled during low (or non) power operations. When a phase change material forms the reservoirs, the phase change material changes phase from an initial solid state to a liquid state over time having a high latent heat absorbency for cooling the package more efficiently than without the phase change material. When the power is low or there is no power dissipated in the system, the phase change material will cool slowly and regain its solid shape. By attaching (or removing) the heat spreader, the phase change material "pockets" are activated (or deactivated) thermally.

Figure 9:
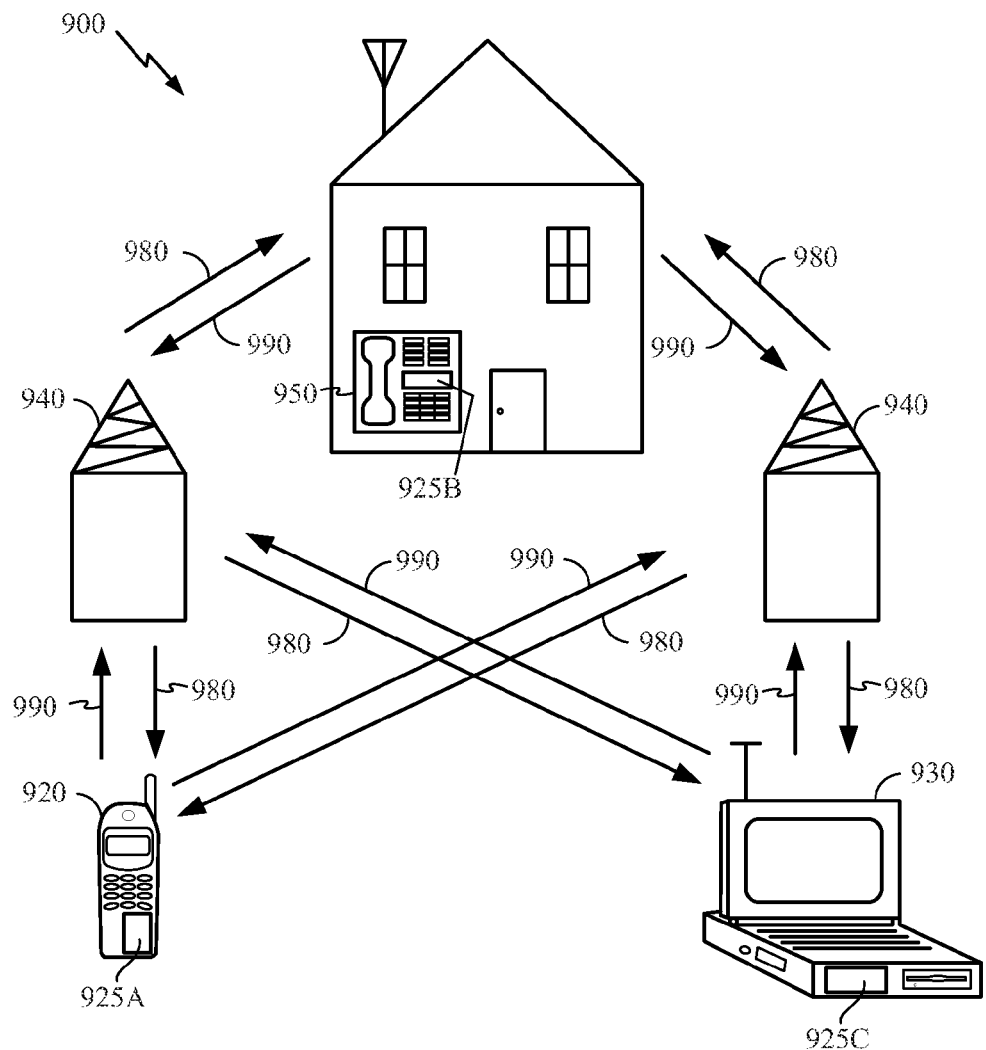
FIG. 9 is a block diagram illustrating a wireless communication system in which an aspect of the disclosure may be advantageously employed.

FIG. 9 is a block diagram showing, an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B, that include the capacitive thermal material. It will be recognized that any device containing an IC may also include the capacitive thermal material, including the base stations, switching devices, and network equipment. FIG. 9 shows forward link signals 1080 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 9 illustrates remote units according to the teachings of the disclosure, the disclosure is not limited to these exemplary illustrated units. Aspects of the present disclosure may be suitably employed in any device which includes the capacitive thermal material.

For a firmware and/or software implementation of the design/fabrication process, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
   an integrated circuit (IC) package including a heat generating device, said heat generating device having a horizontal surface and one or more lateral surfaces substantially perpendicular to the horizontal surface;
   a heat spreader having a horizontal surface coupled to the horizontal surface of the heat generating device;
   a mold compound encapsulating at least a portion of the IC package;
   a plurality of thermal material reservoirs within the mold compound and contacting the horizontal surface of the heat spreader, the thermal material reservoirs at least partially surrounding said one or more lateral surfaces of the heat generating device; and a thermal material capable of phase change between a solid state and a liquid state stored in at least one of the thermal material reservoirs.

2. The apparatus of claim 1, in which the thermal material reservoirs contact at least one of said one or more lateral surfaces of the heat generating device.

3. The apparatus of claim 1, in which the thermal material reservoirs are disposed external to the IC package.

4. The apparatus of claim 3, in which the thermal material reservoirs contact the IC package.

5. The apparatus of claim 1, in which the thermal material reservoirs are disposed on any or all of said one or more lateral surfaces of the heat generating device.

6. The apparatus of claim 1, incorporated into at least one of a music player, a video player, an entertainment unit, a navigation device, a communications device, a personal digital assistant (PDA), a fixed location data unit, and a computer.

7. The apparatus of claim 1, further comprising:
a thermal interface material disposed between the horizontal surface of the heat generating device and the horizontal surface of the heat spreader.

8. An apparatus, comprising:
an integrated circuit (IC) package including a heat generating device, said heat generating device having a horizontal surface and one or more lateral surfaces substantially perpendicular to the horizontal surface;

a heat spreader having a horizontal surface coupled to the horizontal surface of the heat generating device;

a mold compound encapsulating at least a portion of the IC package; and means for thermally managing heat within the mold compound and contacting horizontal surface of the heat spreader, the means for thermally managing heat at least partially surrounding said one or more lateral surfaces of the heat generating device, the means for thermally managing heat comprising means for storing a thermal material capable of phase change between a solid state and a liquid state.

9. The apparatus of claim 8, in which the means for thermally managing heat contacts at least one of said one or more lateral surfaces of the heat generating device.

10. The apparatus of claim 8, in which the means for thermally managing heat is disposed external to the IC package.

11. The apparatus of claim 10, in which the means for thermally managing heat contacts the IC package.

12. The apparatus of claim 8, in which the means for thermally managing heat is disposed on any or all of said one or more lateral surfaces of the heat generating device.

13. The apparatus of claim 8, incorporated into at least one of a music player, a video player, an entertainment unit, a navigation device, a communications device, a personal digital assistant (PDA), a fixed location data unit, and a computer.

* * * * *